United States Patent [19]

Laude

[11] Patent Number: 4,940,907
[45] Date of Patent: Jul. 10, 1990

[54] PRECISION CMOS COMPARATOR WITH HYSTERESIS

[75] Inventor: David P. Laude, Colorado Springs, Colo.

[73] Assignee: Ford Motor Company, Dearborn, Mich.

[21] Appl. No.: 299,188

[22] Filed: Jan. 19, 1989

[51] Int. Cl.$^5$ .............................................. H03K 5/24
[52] U.S. Cl. .................................. 307/359; 307/362; 307/363
[58] Field of Search ................ 307/355, 359, 362, 363

[56] References Cited

U.S. PATENT DOCUMENTS

| | | |
|---|---|---|
| 4,047,059 | 9/1977 | Rosenthal . |
| 4,069,431 | 1/1978 | Kucharewski . |
| 4,096,430 | 6/1978 | Waldron . |
| 4,110,641 | 8/1978 | Payne . |
| 4,394,587 | 7/1983 | McKenzie et al. . |
| 4,406,955 | 9/1983 | Lo Cascio .......................... 307/359 |
| 4,438,349 | 3/1984 | Shoji . |
| 4,556,805 | 12/1985 | Shoji . |
| 4,598,215 | 7/1986 | Schechtman et al. ............. 307/355 |
| 4,658,157 | 4/1987 | McGowan ......................... 307/355 |
| 4,670,671 | 6/1987 | De Weck ........................... 307/355 |
| 4,733,107 | 3/1988 | O'Shaughnessy et al. ......... 307/359 |
| 4,775,807 | 10/1988 | Bukowski, Jr. .................... 307/359 |

*Primary Examiner*—John Zazworsky
*Attorney, Agent, or Firm*—Peter Abolins; Clifford L. Sadler

[57] ABSTRACT

A CMOS comparator has programmable hysteresis using a differential pair of MOS transistors, a current mirror pair of transistors and a feedback path which is function of comparator output, MOSFET threshold voltage and digitally selectable inputs. The comparator has characteristics suitable for sensing and processing low level signals from a variable reluctance sensor in an electrically noisy environment.

21 Claims, 4 Drawing Sheets

PRECISION CMOS COMPARATOR WITH HYSTERESIS

BACKGROUND OF THE INVENTION

1. Field of the Invention

This invention relates to integrated circuits using complementary metal oxide semiconductors (CMOS), which circuits exhibit hysteresis such that the circuit output switches between high and low voltage levels in response to input voltage causing the switching to occur in a first direction at an input voltage which differs from the voltage causing switching in an opposite direction by an incremental hysteresis voltage.

2. Prior Art

U.S. Pat. Nos. 4,110,641 to Payne and 4,394,587 to McKenzie et al disclose CMOS comparators with hysteresis, each having a current mirror circuit connected to a differential pair of transistors.

The patent to McKenzie et al teaches a hysteresis circuit added to a differential comparator to provide a predetermined bias current from one of two input transistors connected in a differential configuration. A current mirror structure is used to accurately determine the amount of current which is shunted when the output of the comparator is in a predetermined state. In accordance with this patent, the hysteresis is a function of device sizes and device characteristics which is influenced by manufacturing process and temperature various. Further, the hysteresis is also a function of current source 38 shown in FIG. 1 of the McKenzie et al patent. There is no teaching of how a constant current sink operates to null out manufacturing process and temperature effects in order to maintain a predetermined and a fixed hysteresis.

The patent to Payne teaches a CMOS voltage comparator with internal positive current feedback to achieve a predetermined hysteresis. The voltage level at which the switching occurs can be set. Hysteresis is introduced such that when the set voltage level is exceeded, the output switches and will remain in that state until the input voltage drops by a predetermined hysteresis voltage. The patent teaches hysteresis in both directions of the input signal, one being positive and one being negative. Although the circuit hysteresis is controllable, it is not precisely predictable as would be desired. The patent requires a constant current, which is not described, to control the hysteresis and which must be continuously adjusted to control the hysteresis as precisely as desired over temperature and process variations. That is, there is no automatic adjustment for such variations.

U.S. Pat. No. 4,047,059 issued to Rosenthal teaches a comparator which has no means for hysteresis and thus detects only the differential input zero crossing while maintaining information on the common mode signal component.

U.S. Pat. No. 4,556,805 issued to Shoji teaches a comparator circuit with a hysteresis characteristic comprising an amplifier comparing an input voltage with a reference voltage, a voltage-clamping circuit clamping the output voltage of the amplifier at a first stabilized voltage or at a second stabilized voltage in response to the comparison output of the amplifier, and a feedback circuit generating a first feedback voltage or a second feedback voltage as the reference voltage in response to the output voltage level of the amplifier, whereby the hysteresis voltage of the comparator circuit is substantially independent of the variation in a power supply voltage for actuating the comparator circuit. The patent does not teach a fully differential circuit. In other words, one input is tied up for the purpose of receiving a hysteresis signal. Thus the input signal is sensed with respect to ground. In a differential comparator, one input is compared against the other, both of which may have input signals on them.

U.S. Pat. No. 4,438,349 issued to Shoji teaches a hysteresis circuit wherein hysteresis is dependent on device characteristics and thus dependent on processing and temperature. Advantageously, more precision would be desired without such dependence.

U.S. Pat. No. 4,069,431 issued to Kucharewski teaches a current mirror amplifier with controlled current gain, the current gain being changed responsive to the output condition of a comparator in which the current mirror amplifier is used in a differential signal combining circuit. In such a comparator application the switched gain of the current mirror amplifier imparts hysteresis to the comparator characteristics. However, it would be desirable to have control over hysteresis to be more precise and not to depend on process, temperature and supply voltage variations. Further, it would be desirable to better control the amount of feedback provided by the feedback circuit so as to compensate for process and temperature variation.

U.S. Pat. No. 4,096,430 issued to Waldron teaches a MOS voltage reference including four MOS transistors connected in feedback circuit relationship, with the ratio of device width to length being essentially the same in the first two devices in order to provide an output voltage which is substantially constant over a range of input voltages and of temperatures.

It would be desirable to have a precision comparator in order to be able to detect small signals from a variable reluctance sensor and to be insensitive to manufacturing process or temperature variation. Further, it would be desirable that such a circuit be implemented by a digital CMOS process which can be used to perform logic functions, one of which would be to digitally filter noise. Further, it would be advantageous to have a comparator with hysteresis levels which can be digitally adjusted in a precise fashion so that as signal levels increase hysteresis can increase to further aid noise rejection. These are some of the problems this invention overcomes.

SUMMARY OF THE INVENTION

This invention teaches a precision CMOS comparator with hysteresis. An input gate protection circuit, a programmable hysteresis comparator, and a comparator voltage reference are advantageously used together. In particular, the programmable hysteresis comparator includes a differential pair of CMOS transistors. The differential pair of CMOS transistors is coupled to a current mirror pair of transistors. The CMOS transistors at the output of such a combination of the differential pair and current mirror are connected in such a way as to provide for a programmable hysteresis function. The comparator voltage reference circuit provides a controlled gate source voltage (i.e. a MOSFET threshold voltage) that adjusts itself automatically so as to maintain a fixed and predictable hysteresis in the programmable hysteresis comparator despite process and temperature variations.

DETAIL DESCRIPTION OF THE INVENTION

Figure 1:
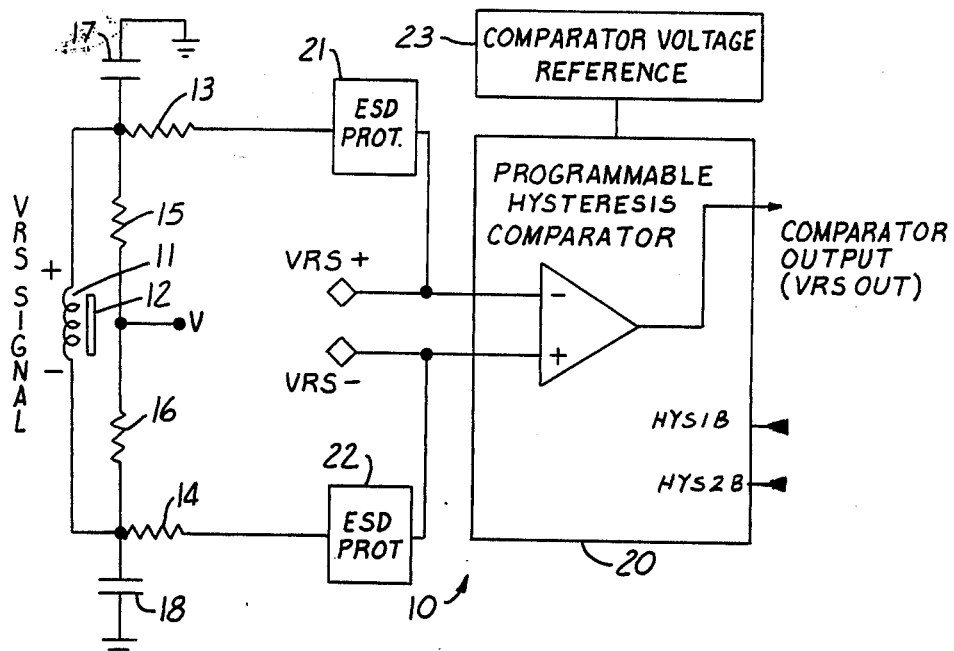
FIG. 1 is a schematic drawing, partly in block, of a system for engine angular speed control application of a precision CMOS comparator with hysteresis in accordance with embodiment of this invention.

Referring to FIG. 1, a CMOS comparator 10 is coupled through resistors 13 and 14 to a variable reluctance sensor (VRS) 11 which is responsive to relative movement of magnetic field lines of a magnet 12. Magnet 12 is enclosed in the same package as VRS 11 and the movement of an external ferrous metal toothed wheel varies the reluctance and causes a VRS signal to develop. A combination of resistors 15 and 16 is coupled across variable reluctance sensor 11 to provide resistive loads for VRS 11 and a DC common mode bias for a programmable hysteresis comparator (PHC) 20. A capacitor 17 is coupled from one side of variable reluctance sensor 11 to ground and capacitor 18 is coupled from the other side of variable reluctance sensor 11 to ground. Resistor 13 is connected from a junction of capacitor 17 and resistor 15 to programmable hysteresis comparator (PHC) 20 through an electrostatic damage protection circuit (ESD) 21. Similarly, resistor 14 is connected from the junction of resistor 16 and capacitor 18 to the input of programmable hysteresis comparator 20 through an ESD 22. A comparator voltage reference (CVR) 23 supplies a reference voltage input to programmable hysteresis comparator 20.

Capacitors 17 and 18 act as a noise filter. Resistors 13 and 14 typically have a value of about 100K ohms and are current limiting resistors and also provide electrostatic damage protection. Resistors 15 and 16 are bias resistors for variable reluctance sensor 11. Resistors 15 and 16 typically each have a value of about 10K ohms. A voltage applied to the junction of resistors 15 and 16 is the bias voltage and typically is about 1.5 volts.

Figure 2:
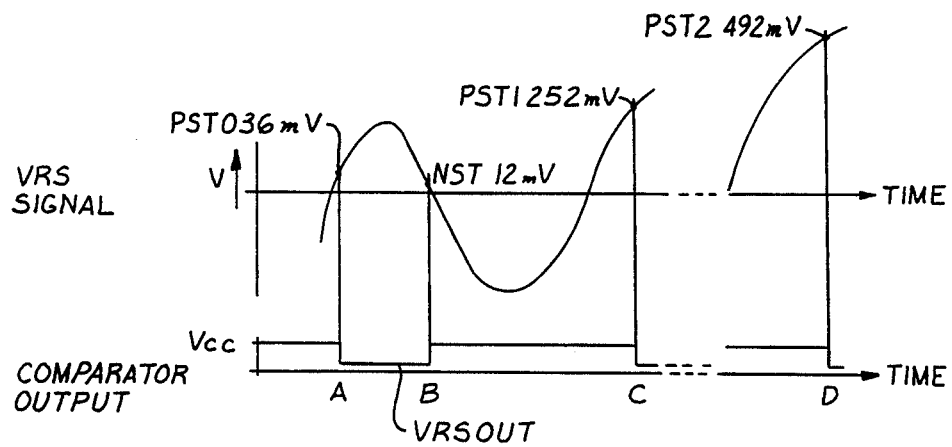
FIG. 2 is a graphic illustration of signals at various points of FIG. 1.

Referring to FIG. 2, the output of variable reluctance sensor 11 is plotted against time and compared to the output of comparator 20 plotted with respect to time. At time point A, the VRS signal is increasing to a positive switch point set at 36 millivolts and the comparator output switches from a high ($V_{cc}$) output to a low output. At time point B, decreasing VRS signal passes through a negative going switch point at 12 millivolts and the comparator output goes from a low to a high state ($V_{cc}$). At time point C, a positive going VRS signal goes through a new reprogrammed positive switch point at 252 millivolts and the output of the comparator switches from high ($V_{cc}$) to low. At time point D, a positive going VRS signal goes through a positive switch point which has been reprogrammed to 492 millivolts and the comparator output switches from high ($V_{cc}$) to low.

Figure 3:
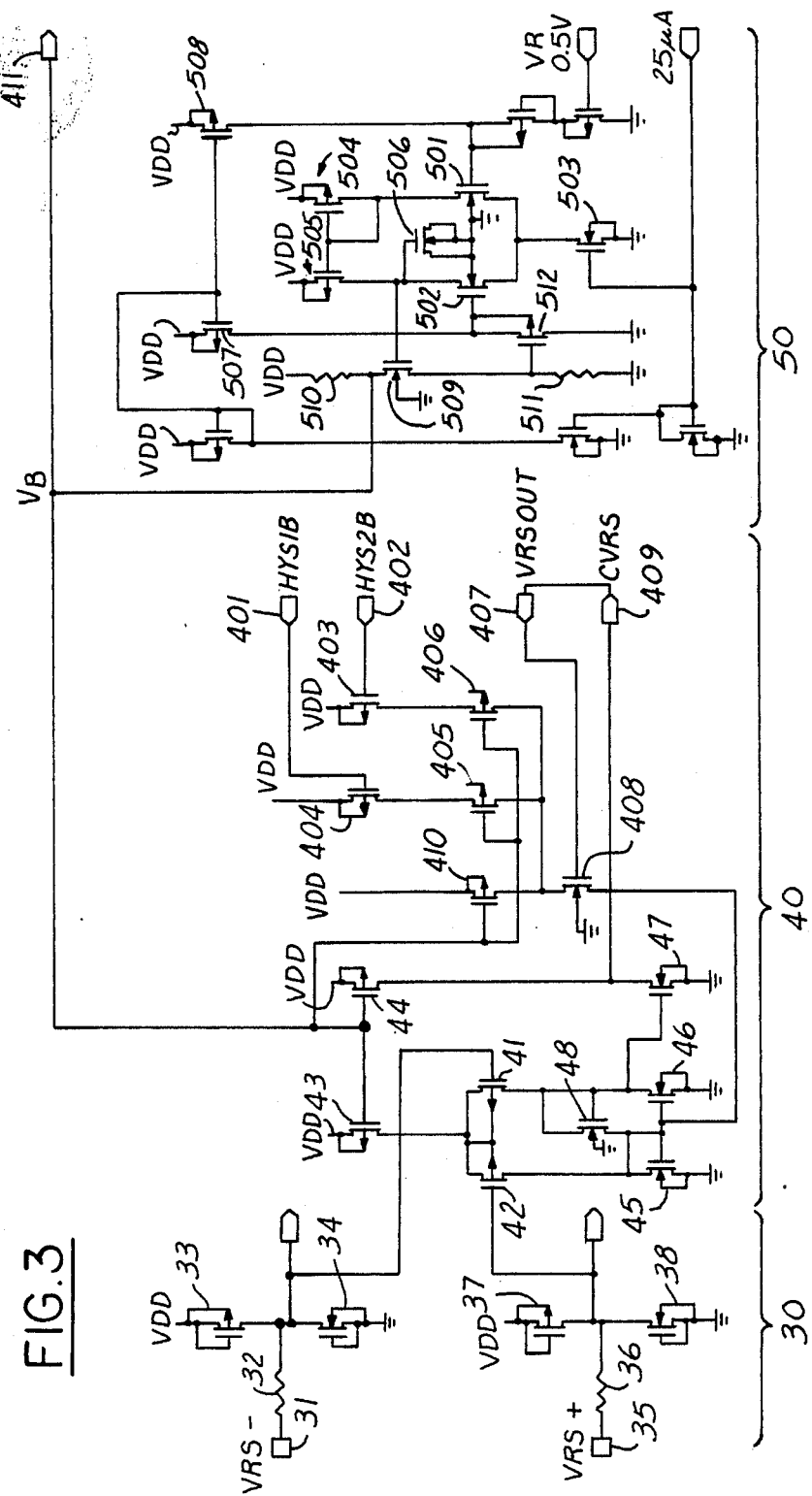
FIG. 3 is a schematic diagram of a programmable hysteresis comparator in accordance with an embodiment of this invention having an input from an input gate protection circuit and an input from a comparator voltage reference circuit.

Referring to FIG. 3, an input gate protection circuit 30 is coupled to a differential programmable hysteresis comparator circuit 40 which is in turn coupled to a comparator voltage reference circuit 50.

Referring to input gate protection circuit 30, an input gate 31 from VRS 11 is coupled through a resistor 32 to a pair of CMOS transistor voltage clamps 33 and 34. Analogously, a positive input gate 35 from a VRS 11 is coupled through a resistor 36 to a pair of CMOS transistor voltage clamps 37 and 38. The output from transistors 33 and 34 is applied to the input of a transistor 41 of programmable hysteresis comparator 40 and the output of transistors 37 and 38 is applied to the input of a transistor 42 of programmable hysteresis comparator 40. Transistors 41 and 42 are a balanced pair of differential transistors and are current biased through a transistor 43 and a transistor 44. Balanced pair differential transistors 41 and 42 are connected to ground through a current mirror including a transistor 45 and a transistor 46 coupled from the drains of transistors 42 and 41, respectively.

The operation of a current mirror is such that the magnitude of the current established in one transistor will also determine the current flowing through other, generally parallel, transistors. That is, the currents in the other transistors are reflections of the current in the first transistor, the relationship of the currents being dependent on the physical constants associated with the individual transistors. Current mirrors are further discussed below.

As discussed above, input signals from variable reluctance sensor (VRS) 11 at gate 31 (minus) and at gate 35 (positive) are applied to programmable hysteresis comparator 40 shown in FIG. 3. For simplicity, assume for the moment that all circuitry to the right of transistor 44 is open circuited and that transistor 44 has a forced gate-source voltage which results in a drain current of several tens of microamps. As a result, differential pair of transistors 41 and 42 feed current mirror transistors 45 and 46 and a second voltage gain stage, transistor 47. When the VRS— input at gate 31 is more negative than the VRS+ input at gate 35, transistor 41 has more drain current than transistor 42 and the drain of transistor 46 is pulled high with the help of current mirror transistors 45 and 46. This results in transistor 47 being turned on and its output 409, CVRS, going low. When VRS— is more positive than VRS+, the opposite reaction occurs.

The two stages together have a DC voltage gain greater than 5K. Transistor 48 is a clamp that limits the travel of the drain of transistor 46 to reduce charge injection from the drain to the gate of transistor 41. The VRS— input 31 is loaded by a 100K resistor 32 and it does not take much charge injected current from transistor 41 to develope a noise voltage across it. But, this occurs only after the comparator switches and therefore does not cause accuracy or timing errors. The 12 mV negative slope trigger (NST) at time point B of FIG. 2 is accomplished by making the channel width of transistor 42 slightly larger than that of transistor 41 thus requiring a larger gate-source voltage on transistor 41 than transistor 42 (VRS− more negative than VRS+) to switch programmable hysteresis comparator 40 (see FIG. 4 and Appendix A for more detail).

The components to the right of transistor 44 are responsible for the programmable hysteresis (positive slope trigger, PST, for the VRS signal). First, assume that HYS1B input 401 and HYS2B input 402 are a logic high. Thus, transistor 404 and transistor 403 are off and no current can flow through transistor 405 and 406. Also, assume VRSOUT output 407, which follows CVRS and can be a digitally filtered version of CVRS, is high so that transistor 408 is on. The drain current of transistor 410 then is conducted through a feedback path including transistor 408 to the current mirror transistor 45 and 46 which effectively produces an imbalance. Because the gates of devices 405 and 406 are coupled to comparator voltage reference $V_B$, the imbalance is independent of process and temperature variations.

This imbalance must be overcome by the differential transistor pair 41 and 42 before an input signal will switch comparator 40, thus the threshold has been modified (see FIG. 6 and Appendix B for a detailed analysis) when CVRS output 409 is high, which it is after a negative slope trigger. Transistor 410 provides enough current to result in a threshold of 36 mV. Once the threshold has been passed and the output switches, transistor 408 turns off and we are back to the 12 mV threshold. Digital signals at HYS1B digital input 401 and HYS2B digital input 402 turn on or off devices (404 acting on 405, and 403 acting on 406) that supply more current for even greater hysteresis. That is, primary hysteresis is established by turning device 408 on. Additional hysteresis is established by turning on devices 405, 406, selectively, in response to logic 1 inputs applied at input 401 (HYS1B) and input 402 (HYS2B). Various combinations of these inputs produce the positive slope threshold triggers shown in FIG. 2 (PST0 at 36mV, PST1 at 252mV, and PST2 at 492mV). It is important to note that from the analysis of Appendix A transistors 41, 42, 43, 410, 404 and 403 must be well ratioed and that MOSFET device threshold voltage (VT), P-channel hole mobility ($\mu$), and P-channel gate oxide capacitance (COP) match. For this reason, P-channel devices are advantageously used so that the body effect can be eliminated by tying body to source on all those devices. Also, from Appendices A and B it can be seen that the VGS on transistor 43 supplied by the CVR is critical for good control of hysteresis and that it must be the sum of a constant voltage and P channel threshold (VTP).

Figure 4:
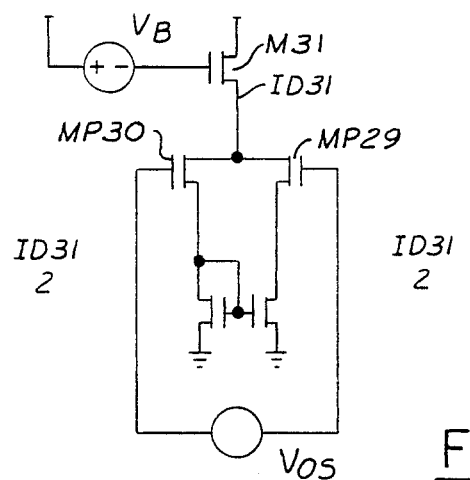
FIG. 4 is a schematic diagram of a circuit used in establishing an offset for a programmable hysteresis comparator and for determining comparator negative slope threshold (NST) voltage in accordance with an embodiment of this invention, as discussed in Appendix A.
Figure 6:
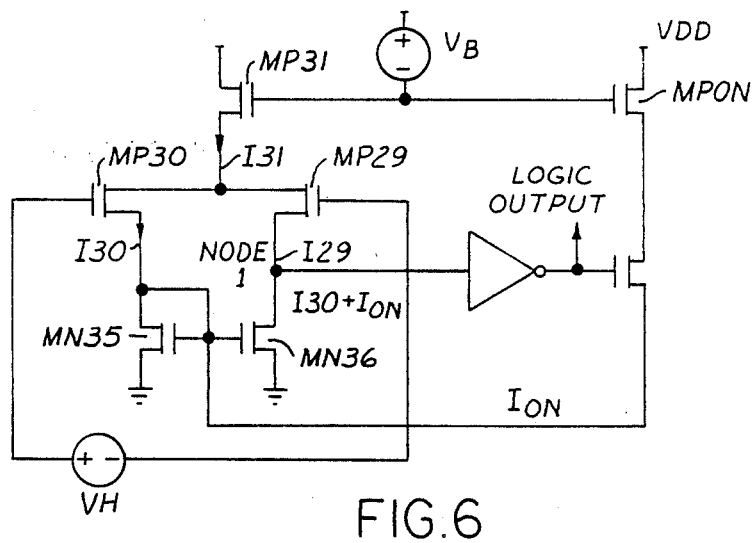
FIG. 6 is a schematic diagram of a circuit used for determining the magnitude of comparator hysteresis and comparator positive slope threshold (PST) voltage in accordance with an embodiment of this invention, as discussed in Appendix B.

FIG. 4 is included in FIG. 6, which relates to FIG. 3 as follows: MP30 is device 42, MP29 is device 41, MPON is devices 410, 405, 406, the logic inverter is devices 44, 47 (with the output being coupled to device 408), and VH is a voltage of convenience for calculation related to input signal VRS.

Figure 5:
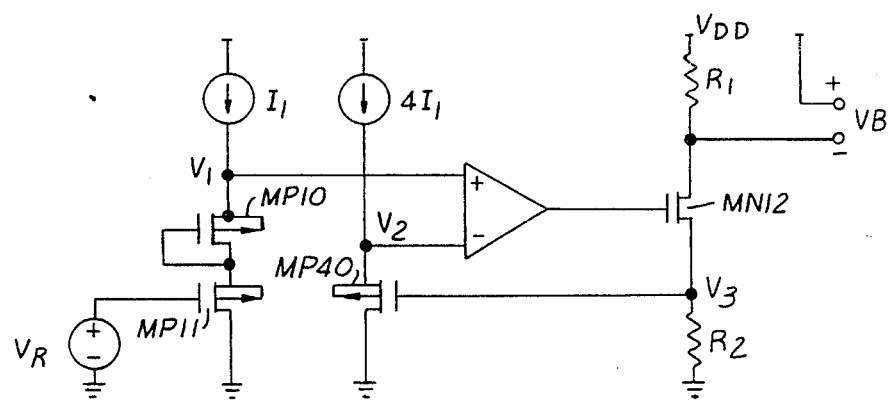
FIG. 5 is a schematic diagram of a circuit used for a programmable hysteresis comparator voltage reference analysis in accordance with an embodiment of this invention, as discussed in Appendix C.

Referring to FIG. 3, comparator voltage reference (CVR) 50 output 411 provides a well controlled gate source bias voltage for PHC 40. This voltage, VB, is equal to VTP+0.5V, for example, which is required by PHC 40 to give the proper process and temperature independent hysteresis characteristics. The analyses that show process and temperature independence are given in Appendices A and B. Also VB must be made relative to VDD as transistors 43 and 44 have their sources connected to VDD and it is their $V_{GS}$ that we wish to control. In CVR 50, devices 501, 502, 503, 504, 505 and 506 function as an operational amplifier. Device 507 supplies four times the current of device 508 by device width ratios as explained further in the derivation of VB given in Appendix C, with reference to FIG. 5. FIG. 5 shows device 508 as current source I1; 507 as current source 4I; devices 501, 502, 503, 504, 505, 506 as an operational amplifier; device 509 as MN12; device 512 as MP40. The output of the operational amplifier is a function of VTP. A feedback path from $V_3$ to MP40 establishes the operational amplifier output and sets $V_1$ substantially equal to $V_2$. Comparator voltage reference output voltage VB is equal to a function of VTP plus the magnitude of VR. Device 509 and resistors 510 and 511 reflect the gate voltage of device 512 (VTP+0.5V) up to VDD. Bias voltage VR, (0.5V) and bias current (+25 $\mu$A) come from a conventional voltage and current bias circuit. The 25 $\mu$A bias current does not affect the accuracy of programmable hysteresis comparator (PHC) 40. Hysteresis of PHC 40 will vary proportionally with the magnitude of the VR bias. As a result, hysteresis of PHC 40 can be varied by both varying the magnitude of VR and the logic signals applied to inputs 401 and 402.

Description of Current Mirror

A current mirror is a circuit in which the current flowing in one part of the circuit is replicated at least once in another part. This is done by forcing the second part of the circuit to operate under conditions which are as similar as possible to those in the first part. The two halves of the circuit are often symmetrical, but not always.

In many situations the original current and its replica current(s) are designed to be equal. However, it is often useful to produce replica currents which are arbitrary multiples or submultiples of the original.

Figure 7:
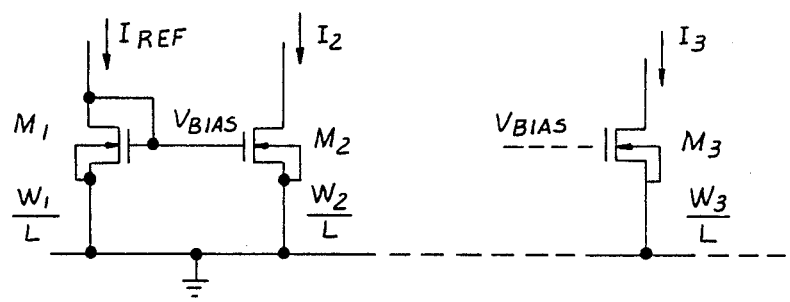
FIG. 7 is a schematic diagram of a current mirror.

A simple example of a current mirror is shown in FIG. 7. Many other topologies are possible, but FIG. 7 serves as a good illustration. In this circuit, multiple replicas of $I_{ref}$ are produced by transistors $M_2$, $M_3$, etc. Using the first order approximation for drain current, $$I_{ds} = (u_{on}C_{ox}W/2L) \times (V_{gs} - V_{tn})^2$$

it can be seen that if two identical devices are forced to operate at the same gate to source voltage $V_{gs}$, and if W and L are equal for the two transistors, their drain currents will be equal. This idea can be extended to include cases in which the devices have different aspect ratios (W/L).

For the simple circuit of FIG. 7, the ratio of $I_2$ to $I_{ref}$ is simply $W_2/W_1$ since both devices have the same length L. Almost without exception, such devices will have the same channel length L in an actual circuit. The output resistance of this circuit is relatively low. Several circuit techniques exist for improving the output resistance, and variations of the cascode technique described below.

Various modifications and variations will no doubt occur to those in the various arts to which this invention pertains. For example, the particular type of transistor may be varied from that disclosed herein. These and all other variations which basically rely on the teachings through which this disclosure has advanced the art are properly considered within the scope of this invention.

| DEFINITIONS FOR APPENDICES PRECISION CMOS COMPARATOR WITH HYSTERESIS |
|---|
| DEFINITION OF TERMS FOR APPENDICE EQUATIONS. |
| PST = THE DESIRED COMPARATOR THRESHOLD VOLTAGE FOR A POSITIVE GOING VRS SIGNAL. |
| NST = THE DESIRED COMPARATOR THRESHOLD VOLTAGE FOR A NEGATIVE GOING VRS SIGNAL. |
| $\mu_P$ OR P = P-CHANNEL MOSFET HOLE MOBILITY |
| CO OR COP = P-CHANNEL GATE OXIDE CAPACITANCE |
| Wxy = CHANNEL WIDTH OF MOSFET xy WHERE xy IS THE TWO DIGIT MESFET NUMBER. |
| Lxy = CHANNEL LENGTH OF MOSFET xy |
| VTP OR VT = P-CHANNEL MOSFET THRESHOLD VOLTAGE |
| VGSxy = GATE SOURCE VOLTAGE OF MOSFET xy |
| IDxy = DRAIN CURRENT OF MOSFET XY |
| VR = REFERENCE VOLTAGE SUPPLIED TO COMPARATOR |
| VOLTAGE REFERENCE. NOMINALLY 0.5 VOLT THE NST AND PSTS ARE PROPORTIONAL TO THIS VOLTAGE. |
| $V_{OS}$ = THE DESIRED COMPARATOR NST VOLTAGE |
| K OR K'xy = $\dfrac{P\ COP\ Wxy}{2\ Lxy}$ FOR MOSFET xy |
| VH = DESIRED AMOUNT OF HYSTERESIS; PST0, PST1 OR PST2 |
| MOSFET EQUATIONS USED: |
| $ID = \dfrac{COP\ PW}{2\ L}(VGS - V_T)^2 = K'(VGS - V_T)^2$ |
| AND FROM ID EQUATION ABOVE: |
| $VGS = \dfrac{2ID\ L}{P\ COP\ W}^{1/2} + VT$ |
| ION = THE TOTAL DRAIN CURRENT FROM ALL "ON" HYSTERESIS CONTROL MOSFETS. THE MOSFETS INCLUDED ARE 405, 406 AND 410 OF FIG. 3. |
| K'ON = THE EFFECTIVE K'xy FOR ALL "ON" HYSTERESIS CONTROL MOSFETS. ITS THE SUM OF THE K'xy OF EACH INDIVIDUAL MOSFET. |

APPENDIX A

DETERMINATION OF COMPARATOR NEGATIVE SLOPE THRESHOLD (NST) VOLTAGE

REFERRING TO FIG. 4, TO ACHIEVE A CONSTANT +12 MV NST FOR THE COMPARATOR:
ID30 = ID29 = ID31/2 THIS CONDITION OCCURS AT THE COMPARATOR SWITCH POINT.

$$ID31 = \frac{W_{31}\ \mu_P\ COP}{2L31}(VB - VTP)^2.$$

TO REMOVE DEPENDENCE ON VTP LET VB = VR + VTP. THIS CONDITION WILL BE GENERATED BY THE COMPARATOR VOLTAGE REFERENCE.

$$\text{THEN}\ ID31 = \frac{W_{31}\ \mu_P\ COP}{2L31}\ VR^2.$$

$$VGS30 - VGS29 = \left(\frac{\frac{W_{31}\mu_P COP}{2L31}V_R^2 L_{30}}{\mu_P COPW_{30}}\right)^{1/2} - \left(\frac{\frac{W_{31}\ \mu_P\ COP}{2L31}V_R^2 L_{29}}{\mu_P\ COP\ W_{29}}\right)^{1/2} = -0.12 = V_{OS}$$
$$= \text{DESIRED NST VOLTAGE}$$

$$= \left(\frac{\frac{W_{31}}{2L31}V_R^2 L_{30}}{W_{30}}\right)^{1/2} - \left(\frac{\frac{W_{31}}{2L31}V_R^2 L_{29}}{W_{29}}\right)^{1/2} = -.012 = V_{OS}$$

$$VGS30 - VGS29 = \left(\frac{\frac{VR^2}{2}L_{30}W_{31}}{L_{31}W_{30}}\right)^{1/2} - \left(\frac{\frac{VR^2}{2}L_{29}W_{31}}{L_{31}W_{29}}\right)^{1/2} = -.012 = V_{OS} =$$

$$VR\sqrt{\frac{W_{31}}{2L_{31}}}\left(\sqrt{\frac{L_{30}}{W_{30}}} - \sqrt{\frac{L_{29}}{W_{29}}}\right) \quad \text{LET}\ L_{30} = L_{29} =$$

$$V_{OS} = VR\sqrt{\frac{W_{31}L_{29}}{2L_{31}}}\left(\sqrt{\frac{1}{W_{30}}} - \sqrt{\frac{1}{W_{29}}}\right) \quad \begin{array}{l}\text{LET}\ W_{30} = NW_{29}\\ \text{WHERE N IS A SCALING FACTOR.}\end{array}$$

$$\boxed{V_{OS} = VR\sqrt{\frac{W_{31}L_{29}}{2L_{31}W_{29}}}\left(-\sqrt{\frac{1}{N}} + 1\right)\\ \text{LET} = X}$$

APPENDIX A-continued
DETERMINATION OF COMPARATOR NEGATIVE SLOPE THRESHOLD (NST) VOLTAGE $$VOS - X = -X\sqrt{\frac{1}{N}} \quad . \quad \frac{VOS - X}{X} = -\sqrt{\frac{1}{N}} \quad .$$

$$\left(\frac{-VOS + X}{X}\right)^2 = \frac{1}{N} \quad . \quad N = \left(\frac{-VOS + X}{X}\right)^{-2}$$

$$N = \left(\frac{-VOS}{VR\sqrt{\frac{W31L29}{2L31W29}}} + 1\right)^{-2} . \quad \text{WHERE N} = \begin{array}{l}\text{DEVICE WIDTH SCALE} \\ \text{FACTOR NEEDED FOR} \\ \text{A DESIRED VOS}\end{array}$$

THUS VOS IS INDEPENDENT OF PROCESS OR TEMPERATURE AND IS DEPENDENT ONLY ON DEVICE CHANNEL DIMENSION RATIOS AND VR.

APPENDIX B
PRECISION DETERMINATION OF COMPARATOR POSITIVE SLOPE THRESHOLD (PST) VOLTAGE

REFER TO FIG. 6.
VH = DESIRED PST VOLTAGE

•GIVEN: $K'30 = K'29 = \frac{\mu P\ COP\ W29}{2L29} \cdot K'35 = K'36.$ (K' IS JUST SHORTHAND)

$$I29 = \frac{I31 + K'29\ VH\sqrt{\frac{2I31}{K'29} \cdot VH^2}}{2} \cdot I30 = \frac{I31 + K'29\ VH\sqrt{\frac{2I31}{K'29} - VH^2}}{2}$$

$I31 = K'31\ (VB - VTP)^2 \cdot ION = K'ON\ (VB - VTP)^2.$

AT THE COMPARATOR TRANSITION I29 = I30 + ION. (A BALANCED CONDITION ON NODE 1 WHEREBY JUST A LITTLE MORE OR LESS CURRENT WILL CAUSE A LARGE VOLTAGE CHANGE WITH A RESULTING CHANGE IN "LOGIC OUTPUT".)

$$ION = I29 - I30 = K'ON\ (VB - VTP)^2 = K'29VH\sqrt{\frac{2I31}{K'29} - VH^2}$$

$$VH = \frac{K'ON\ (VB - VTP)^2}{K'29\sqrt{\frac{2I31}{K'29} - VH^2}} = \frac{K'ON\ (VB - VTP)^2}{K'29\sqrt{\frac{2K'31\ (VB - VTP)^2}{K'29} - VH^2}}$$

TO REMOVE DEPENDENCE OF VH ON VTP LET VB = VR + VTP WHERE VR + VTP WILL BE GENERATED BY THE COMPARATOR VOLTAGE REFERENCE CIRCUIT.

$$VH = \frac{K'ON \cdot VR^2}{K'29\sqrt{\frac{2K'31VR^2}{K'29^1} - VH^2}} = \frac{K'ON \cdot VR^2}{K'29VR\sqrt{\frac{2K'31}{K'29} - \frac{VH^2}{VR^2}}} = \frac{K'ON \cdot VR^2}{K'29\sqrt{\frac{2K'31}{K'29} - \frac{VH}{VR}}}$$

$$VH\left(K'29\sqrt{\frac{2K'31}{K'29} - \left(\frac{VH}{VR}\right)^2}\right) = K'ON\ VR \quad \text{SQUARE BOTH SIDES}$$

$$VH^2K'29^2\left(\frac{2K'31}{K'29} - \left(\frac{VH}{VR}\right)^2\right) = (KON^1VR)^2$$

$$VH^4\left(\frac{-K'\ 29^2}{VR^2}\right) + VH^2\left(\frac{2K'29^2K'31}{K'29}\right) - (K'ONVR)^2 = 0$$

$$VH^4 - VH^2\left(\frac{2K'29^2K'31VR^2}{K'29K'29^2}\right) + \left(\frac{K'ON\ VR^2}{K'29}\right)^2 = VH^4 - VH^2\left(\frac{2K'31\ VR^2}{K'29}\right) + \left(\frac{K'ON \cdot VR^2}{K'29}\right)^2$$

APPENDIX B-continued
PRECISION DETERMINATION OF COMPARATOR POSITIVE SLOPE THRESHOLD (PST) VOLTAGE LET $VH^2 = Vh$
$Vh^2 - Vh\,b + c = 0$
•SOLVE USING QUADRATIC FORMULA:

$$Vh = \frac{-b \pm \sqrt{-4c + b^2}}{2} = \frac{\frac{2K'31VR^2}{K'29} \pm \sqrt{-4\left(\frac{2K'ON\,VR^2}{K'29}\right) + \left(\frac{2K'ON\,VR^2}{K'29}\right)^2}}{2}$$

$$Vh = \frac{K'31}{K'29} VR^2 \pm 1/2 \sqrt{\frac{-4K'ON^2VR^4}{K'29^2} + \frac{2K'31^2VR^4}{K'29^2}}$$

$$Vh = \frac{K'31}{K'29} VR^2 \pm 1/2\,VR^2 \sqrt{\frac{-K'ON^2}{K'29^2} + \frac{K'31^2}{K'29^2}} = VR^2 \left(\frac{K'31}{K'29} \pm \frac{1}{K'29} \sqrt{(K'31)^2 - (K'ON)}\right)$$

$$VH = \frac{VR}{\sqrt{K'29}} \left(K'31 - \sqrt{(K'31)^2 - (K'ON)^2}\right)^{1/2} = \frac{VR}{\sqrt{K'29}} \left(K'31 \left(1 - \sqrt{1 - \left(\frac{K'ON}{K'31}\right)^2}\right)\right)^{1/2}$$

$$VH = VR \left(\frac{W31L29}{W29L31} - \sqrt{\left(\frac{W31L29}{W29L31}\right)^2 - \left(\frac{W\,ON\,L29}{W29\,L\,ON}\right)^2}\right)^{1/2}$$

THIS ASSUMES VT, CO & ARE IDENTICAL FOR ALL DEVICES IN THESE EQUATIONS $$VH = VR \sqrt{\frac{L29}{W29}} \sqrt{\frac{W31}{L31} \left(1 - \sqrt{1 - \left(\frac{W\,ON\,L31}{W\,31\,L\,ON}\right)^2}\right)} \quad \text{LET } L31 = LON$$

$$\boxed{VH = VR \sqrt{\frac{W31L29}{W29\,L\,ON}} \left(1 - \sqrt{1 - \left(\frac{WON}{W\,31}\right)^2}\right)} \quad \begin{array}{l}\text{OR IF}\\ L29 = \\ LON\end{array} \quad \boxed{VH = VR \sqrt{\frac{W31}{W29}} \left(1 - \sqrt{1 - \left(\frac{WON}{W\,31}\right)^2}\right)}$$

THUS VH IS INDEPENDENT OF REP, COP, LXY, PROCESS VARIATION AND TEMPERATURE.

APPENDIX C
COMPARATOR VOLTAGE REFERENCE (CVR) ANALYSIS

REFER TO FIG. 5
THE CVR MUST SUPPLY $-(VTP + .5V)$ WITH RESPECT TO VDD (OR VDD $-$ (VTP $+ .5$) WITH RESPECT TO GND.) FOR THE PROGRAMMABLE HYSTERESIS COMPARATOR. FOR PROCESS AND TEMPERATURE INDEPENDENT OPERATION OF THE COMPARATOR THE $-VTP$ TERM IS REMOVED FROM ALL EQUATIONS THAT DEFINE NEGATIVE AND POSITIVE SLOPE THRESHOLD IN APPENDICES A AND B, RESPECTIVELY. IN ORDER TO DO THIS THE GATE SOURCE BIAS VOLTAGE, VB, IS MADE EQUAL TO VR + VTP. VR IS AN EXTERNALLY APPLIED CONSTANT VOLTAGE BY WHICH NST AND PST ARE CONTROLLED. THAT IS THE OUTPUT SHOWN BELOW.
VR = 0.5 VOLTS NOMINAL.

$$V1 = 0.5 + 2\left(\left(\frac{2I_1\,L10}{W10\mu CO}\right)\right)^{1/2} + VTP\right) \quad \text{LET } \begin{array}{l}L10 = L11 = L40\\ W10 = W11 = W40\end{array}$$

$$V2 = V3 + \left(\frac{2 \cdot 4 \cdot I_1\,L10}{W10\mu CO}\right)^{1/2} + VTP$$

V1 = V2 (THIS IS FORCED BY THE OP-AMP AND MN12)
VB = VDD $-$ IDMN12·R1
IDMN12 = V3/R2    LET R1 = R2

APPENDIX C-continued
COMPARATOR VOLTAGE REFERENCE (CVR) ANALYSIS $$V1 = V2 = 0.5 + 2VTP + \left(\frac{8I_1 L10}{W10\mu CO}\right)^{1/2} = V3 + VTP + \left(\frac{8I_1 L10}{W10\mu CO}\right)^{1/2}$$

THUS $0.5V + VTP = V3$ $$VB = VDD - IDMN12 \cdot R1 = VDD - \frac{R1V3}{R2} = \boxed{VDD - (VTP + 0.5)}$$

I claim:

1. A differential CMOS comparator having an output, said comparator including:
    a programmable hysteresis circuit having a differential pair of MOS transistors and a current mirror pair of transistors coupled to said differential pair of transistors; and
    a comparator voltage reference having an output and being coupled to said programmable hysteresis circuit for providing a reference voltage which is a function of a MOSFET threshold voltage.

2. A differential CMOS comparator as recited in claim 1 wherein said comparator voltage reference includes an operational amplifier having an output which is a function of the MOSFET threshold voltage.

3. A differential CMOS comparator as recited in claim 2 wherein a hysteresis voltage, VR, is coupled to a positive input of said operational amplifier and the output of said comparator voltage reference is a function of the MOSFET threshold voltage plus said hysteresis voltage.

4. A differential CMOS comparator as recited in claim 3 wherein said programmable hysteresis circuit includes:
    a feedback path coupled from the output of said comparator voltage reference to said current mirror pair; and
    said feedback path including a first switching device responsive to an output of said programmable hysteresis circuit.

5. A differential CMOS comparator as recited in claim 4 further comprising:
    a second switching device for applying an input signal to said feedback path in response to a first digital input as a function of the output voltage of said comparator voltage reference.

6. A differential CMOS comparator as recited in claim 5 further comprising:
    a third switch device, coupled substantially in parallel with said second switching device, for applying an input signal to said feedback path in response to a second digital input as a function of the output voltage of said comparator voltage reference.

7. A differential CMOS comparator as recited in claim 1 further comprising an input gate protection circuit having a first input coupled to a first voltage clamp and a second input coupled to a second voltage clamp, and said first and second inputs each being coupled to one of said differential pair of MOS transistors of said programmable hysteresis circuit.

8. A differential CMOS comparator as recited in claim 7 wherein said programmable hysteresis circuit has a current feedback path coupled to said current mirror pair of transistors for selectively controlling a positive slope threshold trigger voltage of an input signal to said CMOS comparator.

9. A differential CMOS comparator as recited in claim 8 wherein said differential pair of MOS transistors have different channel widths to establish different gate-source voltages to switch said CMOS comparator thereby establishing a negative slope threshold trigger voltage.

10. A differential CMOS comparator as recited in claim 9 wherein said comparator voltage reference provides a reference voltage equal to the sum of a MOSFET threshold voltage plus a voltage establishing the amount of hysteresis.

11. A differential CMOS comparator having an output comprising:
    an input circuit having a first signal input coupled to a first voltage clamp MOS pair, a second signal input coupled to a second voltage clamp MOS pair;
    a programmable hysteresis circuit including a differential pair of MOS transistors, one being coupled to said first signal input and the other being coupled to said second signal input, a current mirror MOS pair coupled between said differential pair and ground potential, a first hysteresis input and a second hysteresis input for selecting the amount of hysteresis;
    a comparator voltage reference having a comparator voltage reference output with a signal as a function of a MOSFET threshold voltage and a hysteresis voltage;
    a feedback path coupled between said first and second hysteresis inputs and said current mirror, said feedback path having a first switching device being turned on or off as a function of said comparator output; and
    said feedback path further including a second switching device coupled between said first switching device and said first hysteresis input and a third switching device coupled between said first switching device and said second hysteresis input, said second and third switching devices also being coupled to, and acting in response to said comparator voltage output.

12. A differential CMOS comparator as recited in claim 11 wherein said comparator voltage reference includes an operational amplifier having an output which is a function of said MOSFET threshold voltage, said operational amplifier having a first input, a second input and an output, said first input being coupled to a first signal which is a function of a current source I and a hysteresis voltage VR, said second input being coupled to a second signal which is a function of a current source 4I and a feedback path from said operational amplifier output.

13. A differential CMOS comparator having an output comprising:
    a programmable hysteresis circuit including a differential pair having different channel widths to establish different gate-source voltages to switch said CMOS comparator thereby establishing a negative slope threshold trigger voltage;

said programmable hysteresis circuit further including a current mirror MOSFET pair coupled to said differential pair and responsive to a selectable feedback signal from a feedback path to establish a selectable positive slope threshold trigger voltage;

said feedback path changing said feedback signal as a function of said CMOS comparator output, and controlling comparator hysteresis as a function of a MOSFET threshold voltage, a reference voltage VR and a selectable digital input signal.

14. A differential CMOS comparator as recited in claim 13 wherein said feedback path includes:
 a first selectable digital hysteresis input signal;
 a second selectable digital hysteresis input signal;
 a first series pair of switching devices, one coupled to and acting as a function of said first input signal and the other coupled to and acting as a function of a MOSFET threshold voltage source;
 a second series pair of switching devices, one acting as a function of said second input signal and the other acting as a function of said MOSFET threshold voltage source;
 a third switching device coupled between said current mirror MOS pair and one end of each of said first and second series pair of switching devices, said third switching device acting as a function of said CMOS comparator output; and
 a fourth switching device in series with said third switching device, said fourth switching device acting as a function of said MOSFET threshold voltage source.

15. A differential CMOS comparator as recited in claim 14 wherein said MOSFET threshold voltage source further includes hysteresis means for adjusting the output of said threshold voltage source as a function of a desired hysteresis voltage.

16. A method of comparing signals using programmable hysteresis in a CMOS comparator including the steps of:
 applying a signal to a differential pair of MOS transistors;
 applying an output signal from the differential pair of MOS transistors to a current mirror pair of transistors;
 coupling an additional comparator output to said current mirror pair of transistors; and
 controlling conduction of the current mirror pair as a function of the comparator output, MOSFET threshold voltage and selectable hysteresis voltage levels.

17. A method of comparing signals using programmable hysteresis as recited in claim 16 further including the step of:
 adjusting the channel width of the differential pair of MOS transistors to establish different gate-source voltages to switch the CMOS comparator thereby establishing a negative slope threshold trigger voltage.

18. A method of comparing signals using programmable hysteresis in a CMOS comparator including the steps of:
 applying a differential input signal to each of two pairs of voltage clamp transistors;
 coupling an output from each pair of voltage clamp transistors to an output of one transistor of a differential pair of MOS transistors;
 applying an output signal from the differential pair of MOS transistors to a current mirror pair of transistors;
 adjusting the channel width of the differential pair of MOS transistors to establish different gate-source voltages to switch said CMOS comparator thereby establishing a negative slope threshold trigger voltage; and
 adjusting the conduction of the current mirror pair of transistors as a function of current conducted through the series combination of a first control device being turned on or off as a function of the output of the CMOS comparator and a second control device acting as a function of a selectable digital hysteresis signal.

19. A method of comparing signals as recited in claim 18 wherein the step of adjusting the conduction of the current mirror pair includes the steps of:
 coupling a third and a fourth control device in series with the second control device;
 applying a first digital hysteresis signal to the third control device;
 applying a voltage proportional to the MOSFET threshold voltage to the fourth control device;
 coupling a fifth and sixth control device in series with the second control device; applying a second digital hysteresis signal to the fifth control device; and
 applying a voltage proportional the MOSFET threshold voltage to the sixth control device.

20. A method of comparing signals as recited in claim 19 further comprising the step of generating said MOSFET threshold voltage including the steps of:
 coupling a first input of an operational amplifier to a first current source of a first magnitude,
 coupling a second input of the operational amplifier to a second current source of a second magnitude, greater than the first magnitude; and
 coupling the second input to the output of the operational amplifier so that the output signal is a function of MOSFET threshold voltage.

21. A method of comparing signals as recited in claim 20 further comprising the step of coupling a desired hysteresis voltage to the first input so as to generate a voltage which is a function of the MOSFET threshold voltage and the desired hysteresis voltage.

* * * * *